(12) United States Patent
Liu et al.

(10) Patent No.: US 10,048,576 B2
(45) Date of Patent: Aug. 14, 2018

(54) LASER LIGHT SOURCE AND PROJECTION DISPLAY DEVICE

(71) Applicants: Hisense Co., Ltd., Qingdao (CN); HISENSE USA CORPORATION, Suwanee, GA (US); Hisense International Co., Ltd., Qingdao (CN)

(72) Inventors: Hongyan Liu, Qingdao (CN); Xianrong Liu, Qingdao (CN); Wei Li, Qingdao (CN)

(73) Assignees: HISENSE CO., LTD., Qingdao (CN); HISENSE USA CORPORATION, Suwanee, GA (US); HISENSE INTERNATIONAL CO., LTD., Qingdao (CN)

( * ) Notice: Subject to any disclaimer, the term of this patent is extended or adjusted under 35 U.S.C. 154(b) by 324 days.

(21) Appl. No.: 14/580,433

(22) Filed: Dec. 23, 2014

(65) Prior Publication Data

US 2016/0077416 A1 Mar. 17, 2016

(30) Foreign Application Priority Data

Sep. 11, 2014 (CN) .......................... 2014 1 0461168

(51) Int. Cl.
*G03B 21/20* (2006.01)
*H04N 9/31* (2006.01)
*H01S 5/40* (2006.01)
*H01S 5/00* (2006.01)

(52) U.S. Cl.
CPC ....... *G03B 21/208* (2013.01); *G03B 21/2066* (2013.01); *G03B 21/2073* (2013.01); *H01S 5/4012* (2013.01); *H04N 9/3161* (2013.01); *H04N 9/3164* (2013.01); *H01S 5/005* (2013.01); *H01S 5/0071* (2013.01)

(58) Field of Classification Search
CPC ......... F21V 13/04; F21V 13/14; G03B 21/20; G02B 27/09
See application file for complete search history.

(56) References Cited

U.S. PATENT DOCUMENTS

| | | | | |
|---|---|---|---|---|
| 2003/0047683 A1* | 3/2003 | Kaushal | ................. | G02B 23/12 250/330 |
| 2009/0190101 A1* | 7/2009 | Alasaarela | ............... | G02B 5/04 353/81 |
| 2012/0106183 A1* | 5/2012 | Takahashi | ............ | F21S 48/1145 362/509 |
| 2015/0309399 A1* | 10/2015 | Kim | ........................ | F21V 13/14 353/33 |

* cited by examiner

*Primary Examiner* — Sultan Chowdhury
*Assistant Examiner* — Danell L Owens
(74) *Attorney, Agent, or Firm* — Harness, Dickey & Pierce, P.L.C.

(57) ABSTRACT

The present disclosure relates to a laser light source and a projection display device. The laser light source includes: N groups of laser devices, N convex lenses, a concave lens and at least one reflector component; each convex lens corresponds to a group of laser devices, and is configured to converge light beams emitted by the corresponding group of laser devices; each reflector component corresponds to at least one convex lens and is disposed in a emergent light direction of a corresponding convex lens, and the concave lens is disposed in a emergent light direction of the at least one reflector component; and an emergent light beam of the convex lens corresponding to each reflector component passes through the reflector component and then arrives at the concave lens.

11 Claims, 4 Drawing Sheets

LASER LIGHT SOURCE AND PROJECTION DISPLAY DEVICE

CROSS REFERENCE TO RELATED APPLICATION

This application claims the benefit and priority of Chinese Patent Application No. 201410461168.2 filed Sep. 11, 2014. The entire disclosure of the above application is incorporated herein by reference.

FIELD

The present disclosure relates to the technical field of laser light sources, and particularly relates to a laser light source and a projection display device.

BACKGROUND

This section provides background information related to the present disclosure which is not necessarily prior art.

In recent years, more and more projection display products (referred to as projectors hereinafter) start using laser light sources. The working principle of a laser light source is using laser devices to excite phosphor powder. Generally, after the light power of laser reaches dozens of watts or higher by using low-power laser devices to form a laser array, laser beams are synthesized into a beam of laser through a beam shaping device, and this beam of laser is utilized to excite the phosphor powder to produce required light of other colors, so that light of three primary colors required for output of a projector is formed.

SUMMARY

This section provides a general summary of the disclosure, and is not a comprehensive disclosure of its full scope or all of its features.

The present disclosure relates to a laser light source and a projection display device.

According to an aspect of the disclosure, a laser light source, may include: N groups of laser devices, N convex lenses, a concave lens and at least one reflector component, wherein N represents a positive integer. Each convex lens corresponds to a group of laser devices, and is configured to converge light beams emitted by the corresponding group of laser devices. Each reflector component corresponds to at least one convex lens and is disposed in the emergent light direction of the corresponding convex lens, and the concave lens is disposed in the emergent light direction of the at least one reflector component. The emergent light beam of the convex lens corresponding to each reflector component passes through the reflector component and then arrives at the concave lens.

According to another aspect of the present disclosure, [one embodiment] a projection display device may include any of the laser light sources described herein.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DETAILED DESCRIPTION

Example embodiments will now be described more fully with reference to the accompanying drawings.

One core idea of the present disclosure may be that convex lenses are disposed between laser devices and reflector components, so that light beams emitted by the laser devices are shaped firstly through the convex lenses, the transversal and/or longitudinal sizes of the light beams emitted by the respective groups of laser devices are adjusted, and then the light beams are secondarily shaped by the reflector components.

A laser light source will be introduced below by taking a simple model shown in FIG. 1 as an example.

Figure 1:
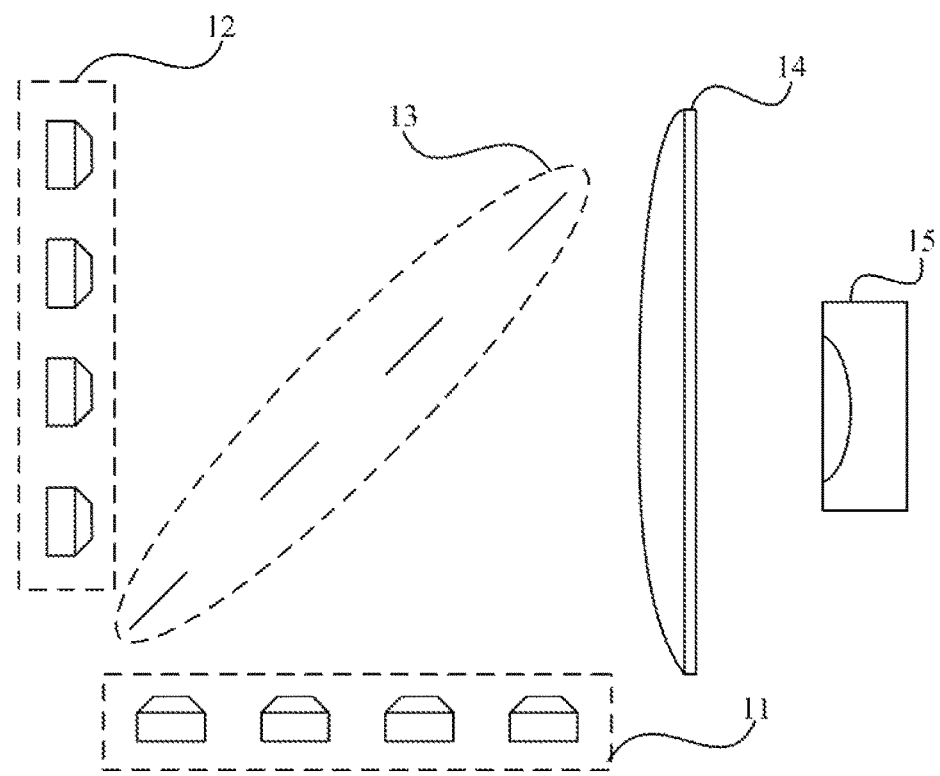
FIG. 1 is a structural schematic diagram of a laser light source according to one embodiment of the present disclosure.

The laser light source shown in FIG. 1 includes: a laser array 11 and a laser array 12 which are perpendicular to each other; a reflector component 13 positioned in front of the two laser arrays and forming included angles of 45° with the two laser arrays respectively; a convex lens 14 positioned in front of the reflector component 13; and a concave lens 15 positioned in front of the convex lens 14.

The reflector component 13, the convex lens 14 and the concave lens 15 form a beam shaping device (also called as a light combining mirror), for shaping light beams emitted by the laser array 11 and the laser array 12 (e.g. changing the transmission direction of the light beams, combining light, converging light and other light path conversion).

The perpendicular laser arrays indicate that the light beams emitted by the laser arrays are perpendicular to each other.

Figure 2:
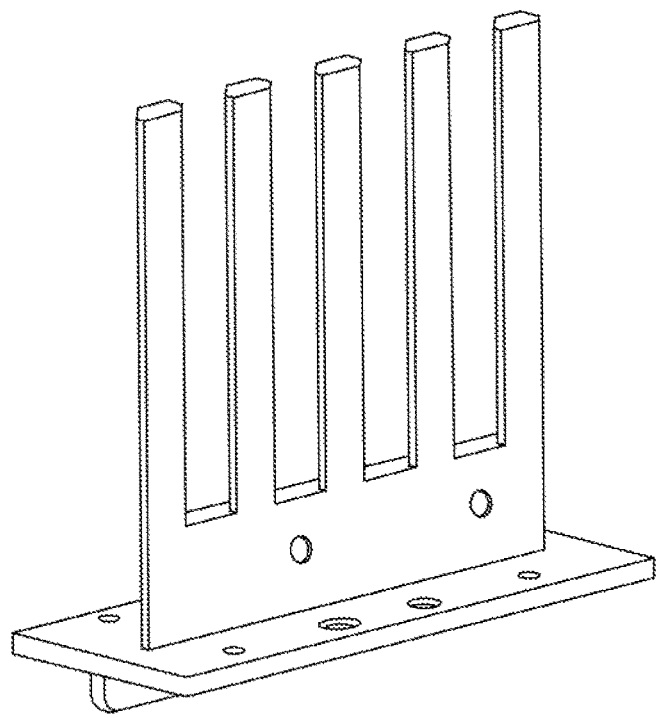
FIG. 2 is a structural schematic diagram of a group of reflectors according to one embodiment of the present disclosure.
Figure 3:
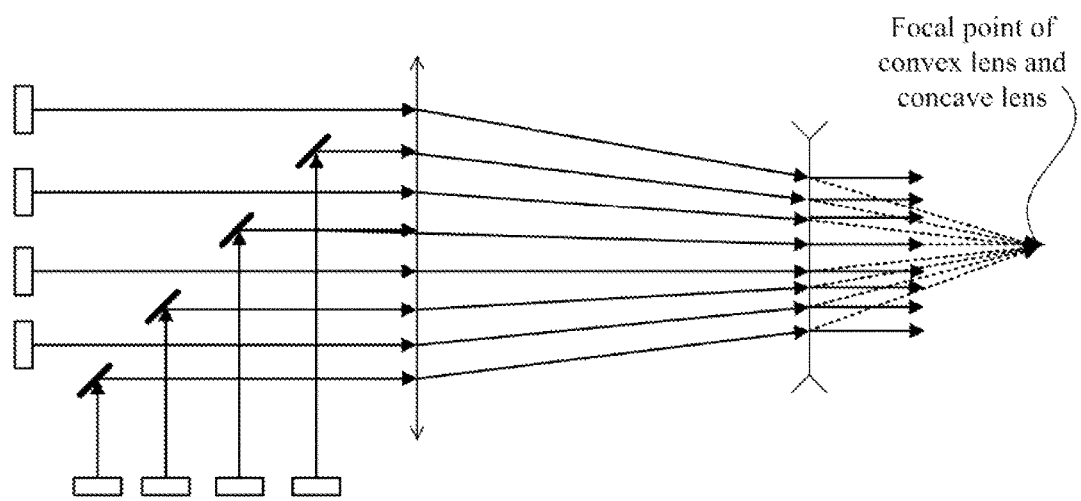
FIG. 3 is a schematic diagram of a light path of the laser light source according to one embodiment of the present disclosure.

The reflector component 13 consists of a group of reflectors disposed on the same plane and a fixing part for the reflectors, as shown in FIG. 2. Predetermined intervals are reserved between the respective reflectors in the group of reflectors, each reflector is configured to reflect part of light beams of the laser array 11, and the intervals between the reflectors are configured for transmission of the light beams of the laser array 12. The reflector component 13 shapes the light beams output by the two laser arrays and then outputs synthesized light beams with the same direction. A telescope composed of the convex lens 14 and the concave lens 15 carries out a series of light path conversion on the light beam synthesized by the reflector component 13. FIG. 3 illustrates the corresponding light path diagram of the laser light source shown in FIG. 1.

A certain distance is reserved between the convex lens 14 and the concave lens 15, and this distance ensures normal transmission and conversion of a light path. If the distance is too short, the light from the light combining mirror may not be converged. Owing to the design requirement of a mechanical structure, certain distances are also reserved between the reflector component 13 and the convex lens 14 and between the reflector component 13 and the laser arrays, to satisfy the condition that the reflector component must completely receive the light beams emitted by all laser devices. These distances impose restrictions on the structure of the laser light source, so that the size of the laser light source is relatively large.

The laser light source provided by another embodiment of the present disclosure includes: N groups of laser devices, N convex lenses, a concave lens and at least one reflector component, wherein N represents a positive integer; each convex lens corresponds to a group of laser devices, and is configured to converge light beams emitted by the corresponding group of laser devices; each reflector component corresponds to at least one convex lens and is disposed in the emergent light direction of the corresponding convex lens, and the concave lens is disposed in the emergent light direction of the at least one reflector component; and the emergent light beam of the convex lens corresponding to each reflector component passes through the reflector component and then arrives at the concave lens.

In one embodiment of the present disclosure, a group of laser devices is a laser array (also referred to as a laser array module) consisting of a plurality of individual laser devices.

Compared with the technology of the embodiment shown in FIG. 1, the beneficial effects of the technical solution provided by this embodiment will be analyzed below.

As shown in FIG. 1, the reflector component is positioned between the laser array and the convex lens, the light path diagram of the light beams is shown in FIG. 3, the light beams emitted by the laser arrays are shaped firstly by the reflectors and projected to the convex lens, and the light beams first pass through the convex lens, and then pass through the concave lens.

In order to enable the emergent light beams of the concave lens to be approximately parallel light, the distance between the convex lens and the concave lens needs to ensure that the focal point of the convex lens and the focal point of the concave lens are overlapped (as shown in FIG. 3), or the focal point of the concave lens is slightly latter than the focal point of the convex lens ("latter" indicates that compared with the focal point of the convex lens, the focal point of the concave lens is closer to the concave lens), due to such a structure, the distance between optical elements should be relatively long, and a specific distance must be considered and reserved in structural design to ensure the optical effect, so that the size of the structure is relatively large, and the structural design of the laser light source is also restricted. In the technical solution of the embodiment of the present disclosure, due to the change of the device structure, the light beam transmission path is changed.

On the one hand, the light beams emitted by the laser devices are converged through the convex lens and then pass through the reflector component, thus the area of the light beams received by the reflectors in the reflector component is reduced, so that all the light beams may be reflected or transmitted with relatively small size. On the other hand, in the technical solution provided by the embodiment of the present disclosure, the convex lens is disposed in front of the reflector component, the light beams emitted by the laser devices are firstly converged through the convex lens, in the light beam converging process, the light beams are shaped by the reflector component and then projected to the concave lens, the light path of shaping the light beams by the reflector component is overlapped with part of the light path of converging the light beams by the convex lens, and thus, in order to achieve the same shaping purpose, the light path or optical distance of the light beams in the whole laser light source is shorter than that in the embodiment shown in FIG. 1.

The travel path of the light beams is closely related to relative positions of the optical devices, the position arrangement of the optical devices actually determines the travel path of the light beams, the light path of the light beams in the laser light source provided by the embodiment of the present disclosure is shorter than that in the embodiment shown in FIG. 1, that is, the optical distance or physical distance between the optical devices in the laser light source provided by the embodiment of the present disclosure is also shorter, and thus the position arrangement of the laser devices and the respective optical devices is more compact than that in the embodiment shown in FIG. 1. To sum up, through the light beam shaping solution of the laser light source provided by the technical solution of the present disclosure, the distribution of the optical devices is more compact, and the size of the reflector component is reduced, so that the size of the laser light source is effectively reduced, and the problem that the present laser light source and a product (such as a projector) including the laser light source are too large in size is solved.

In the embodiment of the present disclosure, the distance between the reflector component and the concave lens needs to ensure that the light beams passing through the reflector component are converged on the focal point of the concave lens or converged when they have not arrived at but close to the focal point of the concave lens, so that the light beams passing through the concave lens are approximately parallel light; the distance between the convex lens and the corresponding laser array is shortened as far as possible on the premise that the mechanical design requirement is met; and the distance between the convex lens and the reflector component is shortened as far as possible on the premise that the mechanical design requirement is met.

The technical solutions provided by embodiments of the present disclosure will be described in detail below in conjunction with the drawings.

In one embodiment of the present disclosure, a reflector component may correspond to two convex lenses or a convex lens.

If a reflector component corresponds to two convex lenses, the reflector component reflects the emergent light beam of one convex lens, and transmits the emergent light beam of the other convex lens.

There are multiple specific implementation structures when a reflector component corresponds to two convex lenses, and several implementation structures will be listed below.

In a first implementation structure when a reflector component corresponds to two convex lenses, the reflector component includes at least one group of reflectors; all the reflectors in the group of reflectors of which the incident light is the emergent light beam of the convex lens corresponding to the reflector component are positioned on the same plane and disposed at intervals, the emergent light beam of the convex lens corresponding to the reflector component is reflected by the reflector component, and the emergent light beam of the other convex lens transmits through the intervals of the reflectors in the group of reflectors.

Figure 4:
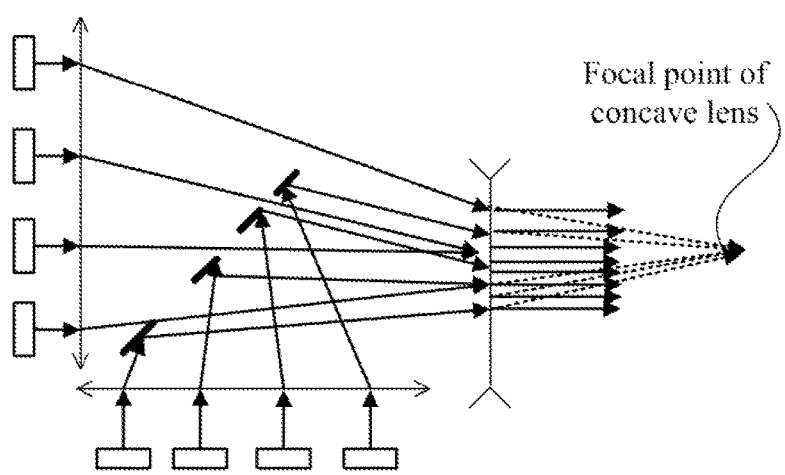
FIG. 4 is a schematic diagram of a light path of a laser light source provided by one embodiment of the present disclosure.
Figure 5:
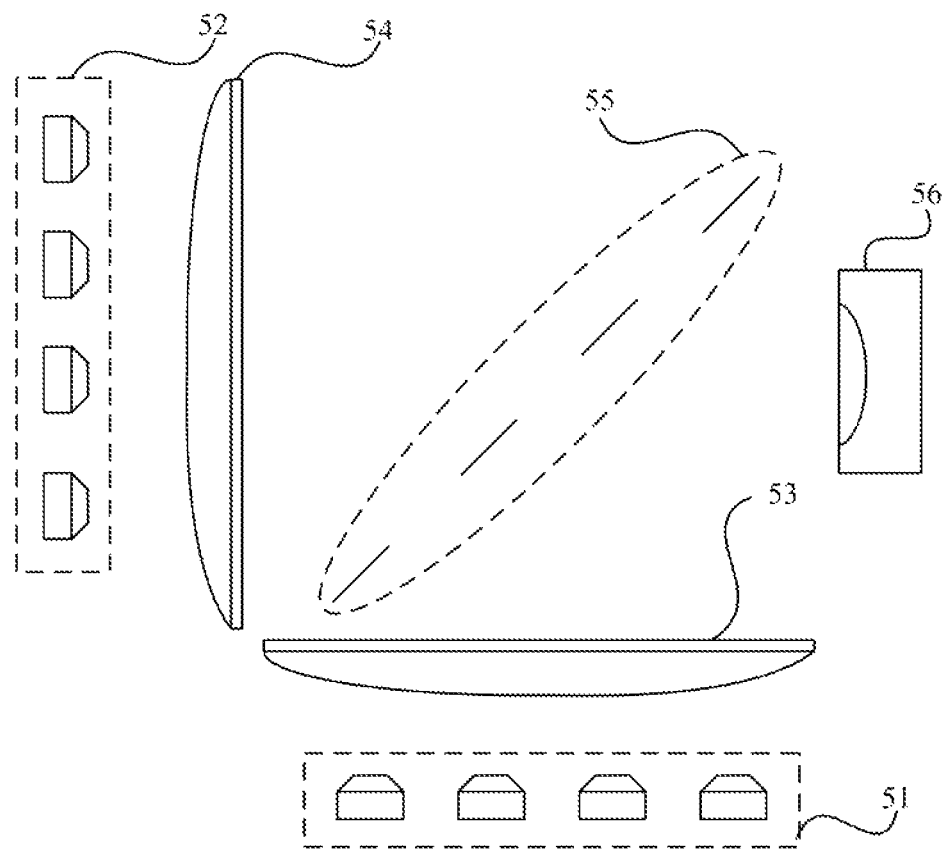
FIG. 5 is a first structural schematic diagram of the laser light source provided by one embodiment of the present disclosure.

The first implementation structure will be described below by taking the simple model of the laser light source shown in FIG. 5 as an example. In FIG. 5, the laser light source includes two laser arrays (a laser array 51 and a laser array 52) which are perpendicular to each other, and a beam shaping device. Each of the laser array 51 and the laser array 52 includes four laser devices; the light beam shaping device includes two convex lenses, a reflector component and a concave lens, where the convex lens 53 corresponds to the laser array 51 and is positioned between the laser array 51 and the reflector component 55, and the convex lens 54 corresponds to the laser array 52 and is positioned between the laser array 52 and the reflector component 55. The reflector component 55 corresponds to the convex lens 53 and the convex lens 54, the included angle between the reflector component 55 and the convex lens 53 and the included angle between the reflector component 55 and the convex lens 54 are 45°, and the reflector component consists of a group of reflectors disposed on the same plane and a fixing part for the reflectors. Each of the reflectors of the reflector component 55 is respectively used to reflect the light beam emitted by one of the laser devices of the laser array 51 and passed through the convex lens 54, the light beams emitted by the laser devices in the laser array 52 are converged through the convex lens 54 and then transmitted through the intervals of the reflectors in the reflector component 55. After the light beams pass through the reflector component 55, the overall width of the light beams is reduced (a synthesized light beam is formed), and all the light beams arrive at the concave lens 56. The synthesized light beam is subjected to light path adjustment through the concave lens 56. The light path diagram of the light beams is shown in FIG. 4.

For the specific implementation structure of the reflector component, reference may be made to FIG. 2, and the difference lies in that the width and/or length of each reflector is determined according to the size of beams required to be reflected, and the interval width of the reflectors is determined according to the size of the light beams required to be transmitted. Of course, it is not necessary that the reflectors of the reflector component are positioned on the same plane, but they should be parallel to each other. In addition, each reflector in the reflector component may have a strip-shaped structure shown in FIG. 2, and may also in a pane or grid shape together with the fixing part.

It should be pointed out that, FIG. 5 is merely exemplarily illustrating the first implementation structure with a reflector component corresponding to two convex lenses. If the two groups of laser devices are not perpendicular to each other, then the convex lenses corresponding to the two groups of laser devices are also not perpendicular to each other, correspondingly, the disposed position and angle of the reflector component need to ensure that the emergent light beam of one convex lens is reflected, the emergent light beam of the other convex lens is transmitted, and the emergent light beams of the two convex lenses pass through the reflectors and then arrive at the concave lens. The specific position and angle of the reflector component are determined according to the size of the laser devices, the focal point positions and disposed positions of the convex lenses by those skilled in the art in combination with the existing optical principle without any creative effort on the premise that the above conditions are given in embodiments of the present disclosure, which is no longer described in detail herein. The laser array corresponding to each of the two convex lenses corresponding to the reflector component does not necessarily include only one row of laser devices but may be a two-dimensional array consisting of a plurality of laser devices, each reflector in the reflector component reflects the light beams emitted by a row or a column of a group of laser devices and converged by the convex lens, and intervals of the reflectors transmit the light beams emitted by a row or a column of the other type of laser devices and converged by a convex lens. A group of laser devices does not necessarily correspond to a convex lens but may also correspond to two or more convex lenses, as long as the light beams passing through these convex lenses and the reflector component could be converged on the focal point of the concave lens, or converged in front of but close to the focal point of the concave lens. The focal points of all the convex lenses corresponding to a group of laser devices are on the same axis.

Figure 6:
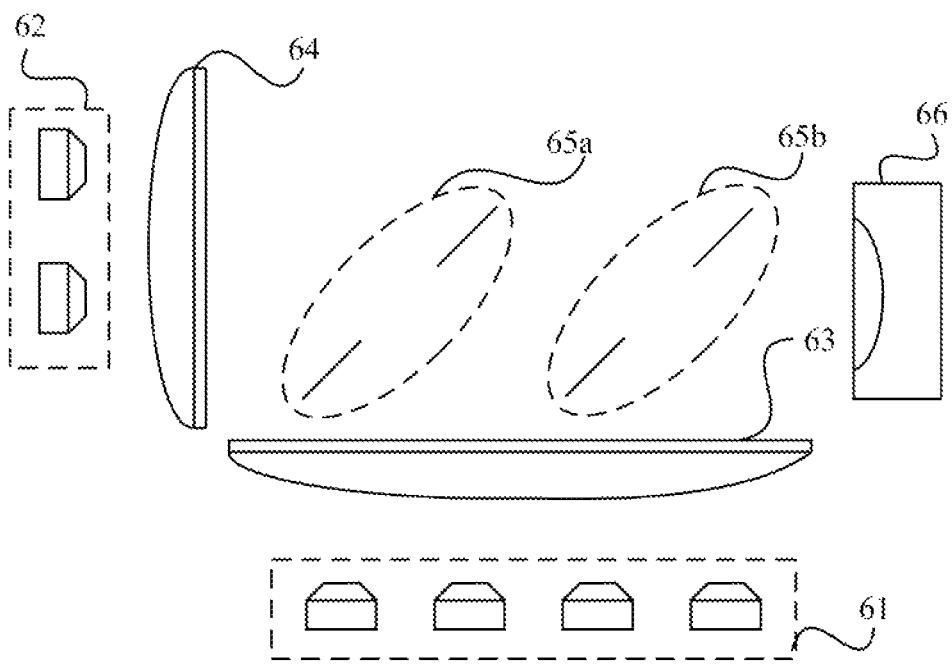
FIG. 6 is a second structural schematic diagram of the laser light source provided by one embodiment of the present disclosure.

In the laser light source shown in FIG. 5, the reflector component merely includes a group of reflectors. For the above first implementation structure, if the reflector component includes two or more or more groups of reflectors, the position, size and the like of the group of reflectors of which the incident light is the emergent light of the other group of reflectors may be implemented in multiple manners and should be determined according to the specific light path requirement and the mechanical design requirement, the present disclosure is not limited thereto, as long as the light beams passing through the reflector component can be combined. Taking the laser light source shown in FIG. 6 as an example, the reflector component includes two groups of reflectors (65a and 65b) for reflecting the light beams emitted by a laser array 61 and converged by a convex lens 63 and transmitting the light beams emitted by a laser array 62 and converged by a convex lens 64. In FIG. 6, the concave lens 66 is configured for light path conversion of incident beams.

In the second implementation structure when a reflector component corresponds to two groups of laser devices, the reflector component is a reflector with wavelength selecting function.

Figure 7:
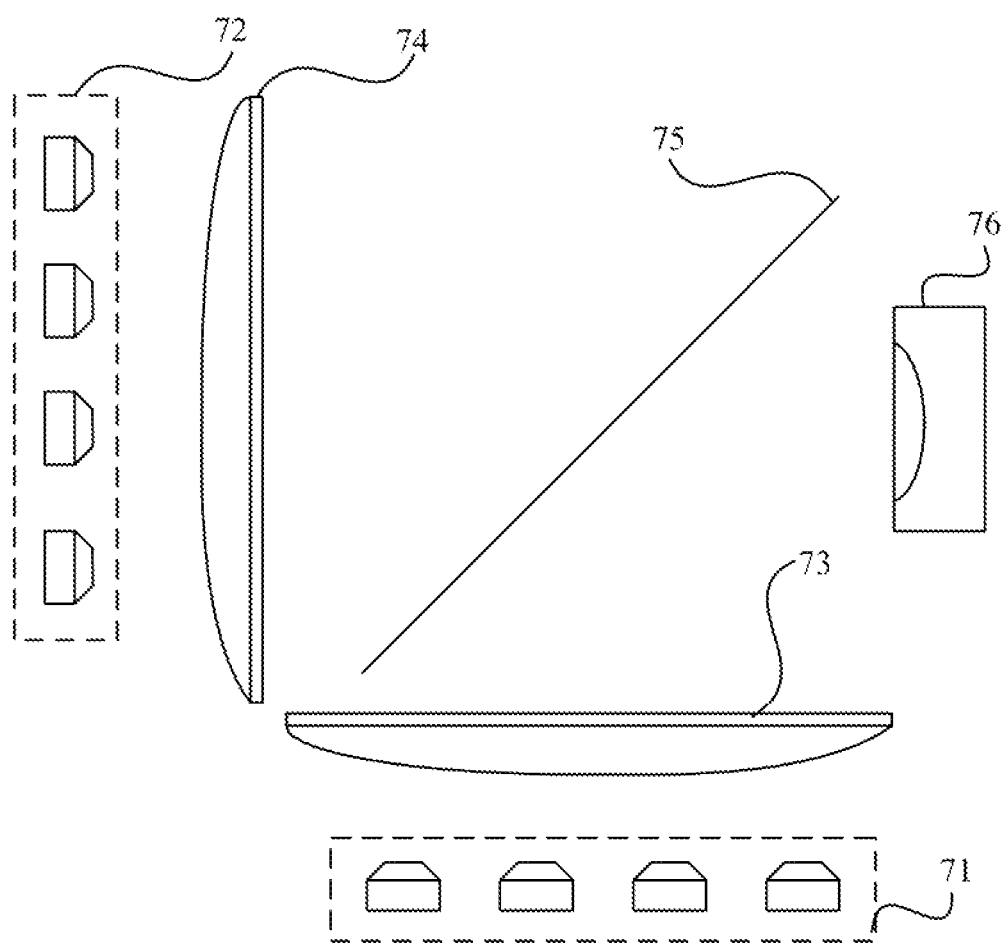
FIG. 7 is a third structural schematic diagram of the laser light source provided by one embodiment of the present disclosure.

The second implementation structure will be described below by taking the simple model shown in FIG. 7 as an example. In FIG. 7, the laser light source includes two laser arrays (a laser array 71 and a laser array 72) which are perpendicular to each other, and a beam shaping device. Each of the laser array 71 and the laser array 72 includes four laser devices, the laser devices of the laser array 71 emit light beams of which the wavelength is a, and the laser devices of the laser array 72 emit light beams of which the wavelength is b; the light beam shaping device includes two convex lenses, a reflector component and a concave lens, where the convex lens 73 corresponds to the laser array 71 and is positioned between the laser array 71 and the reflector component 75, and the convex lens 74 corresponds to the laser array 72 and is positioned between the laser array 72 and the reflector component 75. The reflector component 75 corresponds to the convex lens 73 and the convex lens 74, the included angle between the reflector component 75 and the convex lens 73 and the included angle between the reflector component 75 and the convex lens 74 are 45°, and the reflector component consists of a reflector with wavelength selecting function. The reflector component 75 reflects the light beams emitted by the laser array 71, converged by the convex lens 73 and having the wavelength a, and transmits the light beams emitted by the laser devices in the laser array 72, converged by the convex lens 74 and having the wavelength b. After the light beams pass through the reflector component 75, the overall width of the light beams is reduced (forming a synthesized beam), and all the light beams arrive at the concave lens 76. The synthesized beam is subjected to light path adjustment through the concave lens 76.

It should be pointed out that, based on the above second implementation structure the reflector component may also include two or more reflectors with wavelength selecting function. The position and size of each reflector may be implemented in multiple manners and should be determined according to the specific light path requirement and the mechanical design requirement, the present disclosure is not limited thereto, as long as the light beams passing through the reflector component can be combined. For example, reference may be made to the reflector component of FIG. 6, and the difference lies in that each group of reflectors is replaced by the reflector with the wavelength selecting function.

It should be pointed out that, FIG. 7 is merely exemplarily illustrating the second implementation structure with a reflector component corresponding to two convex lenses. If the two groups of laser devices are not perpendicular to each other, the convex lenses corresponding to the two groups of laser devices are also not perpendicular to each other, correspondingly, the position and angle of the reflector component need to ensure that the emergent light beam of one convex lens is reflected, the emergent light beam of the other convex lens is transmitted, and the emergent light beams of the two convex lenses pass through the reflector and then arrive at the concave lens. The specific position and angle of the reflector component are determined according to the size of the laser devices, the focal point positions and disposed positions of the convex lenses by those skilled in the art in combination with the existing optical principle without any creative effort on the premise that the above conditions are given in embodiments of the present disclosure, which is no longer described in detail herein. The laser array corresponding to each of the two convex lenses corresponding to the reflector component does not necessarily include only one row of laser devices but may be a two-dimensional array consisting of a plurality of laser devices. A group of laser devices does not necessarily correspond to a convex lens but may also correspond to two or more convex lenses, as long as the light beams passing through these convex lenses and the reflector component could be converged on the focal point of the concave lens, or converged in front of but close to the focal point of the concave lens. The focal points of all the convex lenses corresponding to a group of laser devices are on the same axis.

In the third implementation structure when a reflector component corresponds to two groups of laser devices, the reflector component is a polarizer.

If the polarities of the light beams emitted by the laser array 71 and the laser array 72 in FIG. 7 are orthogonal and the reflector component 75 is a polarizer, a third implementation structure is shown.

It should be pointed out that, based on the third implementation structure, the reflector component may also include two or more than two polarizers. The position and size of each polarizer may be implemented in multiple manners and should be determined according to the specific light path requirement and the mechanical design requirement, the present disclosure is not limited thereto, as long as the light beams passing through the reflector component can be combined. For example, reference may be made to the reflector component of FIG. 6, and the difference lies in that each group of reflectors is replaced by a polarizer.

If a reflector component corresponds to a convex lens, the reflector component is configured to reflect the emergent light beams of the corresponding convex lens to the concave lens. For the specific implementation structure of the reflector component, reference may be made to the description of any above-mentioned embodiment.

Based on any above-mentioned embodiment, a group of reflector component may include two groups (two) of or more than two groups (two) of reflectors, and multiple groups of reflectors are coordinated with each other to adjust the size and/or transmission direction of the synthesized light beams. Each group of reflectors may adopt the implementation structure provided by any above-mentioned embodiment. That is, if the reflector component includes two groups of or more than two groups of reflectors, the implementation structure of each group of reflectors may be different, as long as the light beams passing through the reflector component can be combined. Taking the situation that a group of reflector component includes two groups (two) of reflectors as an example, specifically, one group of reflectors is described as the above-mentioned first implementation structure, and the other reflector is the reflector with the wavelength selecting function; or one group of reflectors is described as the above-mentioned first implementation structure, and the other reflector is a polarizer; or one reflector is the reflector with the wavelength selecting function, and the other reflector is a polarizer.

For the structural schematic diagram of the laser light source provided by one embodiment of the present disclosure, reference may be made to FIGS. 5 to 7. In an actual laser light source product, the laser devices, the convex lens, the reflector component and the concave lens are all fixed by the fixing part. For example, these devices are fixed on a metal plate through the fixing part. Since the distance between the optical devices is shortened, the size of a carrier (e.g. the metal plate) for fixing these devices is also reduced.

One embodiment of the present disclosure further provides a projection display device, including the laser light source. In one embodiment of the present disclosure, the projection display device is also called as a projector.

It should be pointed out that, the projector not only includes the laser light source, but also includes a case, a heat dissipation device, a microprocessor and other devices. After the size of the laser light source is reduced, the structure of the projector may be optimized by using the saved space, e.g. the saved space may be utilized to plan the heat dissipation device with a more reasonable structure, so as to avoid overheating of heating devices such as the laser light source.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A laser light source, comprising:
   N groups of laser devices;

N convex lenses;

a concave lens; and at least one reflector component, N representing a positive integer, wherein:

each convex lens corresponds to one of the N groups of laser devices, and is configured to concentrate light beams emitted directly by the corresponding group of laser devices;

each reflector component corresponds to two of the N convex lenses and is disposed in emergent light directions of the two corresponding convex lenses, and the concave lens is disposed in an emergent light direction of the at least one reflector component;

an emergent light beam of the two convex lenses corresponding to each reflector component arrives at the reflector component and then arrives at the concave lens; and each reflector component is configured to reflect an emergent light beam of one of the two corresponding convex lenses and transmit an emergent light beam of the other of the two corresponding convex lenses.

2. The laser light source according to claim 1, wherein:

the at least one reflector component comprises at least one group of reflectors; and when an emergent light beam of one of the N convex lenses corresponding to the at least one group of reflectors is incident light of a group of reflectors in the reflector component, all the reflectors in the group of reflectors are positioned on a same plane and disposed at intervals, wherein a width of the intervals ensures transmission of the emergent light beam of another convex lens corresponding to the reflector component.

3. The laser light source according to claim 2, wherein a size of each reflector in the group of reflectors, of which the incident light is the emergent light beam of at least one of the two convex lenses corresponding to the reflector component, is determined according to a size of a light beam required to be reflected by the reflector; and a width of the interval of each reflector in the group of reflectors, of which the incident light is the emergent light beam of at least one of the two convex lenses corresponding to the reflector component, is determined according to a size of a light beam to pass through the interval.

4. The laser light source according to claim 1, wherein the at least one reflector component is a reflector with a wavelength selecting function.

5. The laser light source according to claim 1, wherein the at least one reflector component is a polarizer, and polarities of the emergent light beams of the two convex lenses corresponding to the polarizer are orthogonal.

6. A laser light source according to claim 1, comprising:

N groups of laser devices;

N convex lenses;

a concave lens; and at least one reflector component, N representing a positive integer, wherein:

each convex lens corresponds to one of the N groups of laser devices, and is configured to concentrate light beams emitted directly by the corresponding group of laser devices;

each reflector component corresponds to one of the N convex lenses and is disposed in an emergent light direction of the corresponding convex lens, and the concave lens is disposed in an emergent light direction of the at least one reflector component;

an emergent light beam of the convex lens corresponding to each reflector component arrives at the reflector component and then arrives at the concave lens; and each reflector component is configured to reflect the emergent light beam of the corresponding convex lens to the concave lens.

7. A projection display device, comprising a laser light source, wherein the laser light source comprises:

N groups of laser devices;

N convex lenses;

a concave lens; and at least one reflector component, wherein:

N represents a positive integer;

each convex lens corresponds to one of the N groups of laser devices, and is configured to concentrate light beams emitted directly by the corresponding group of laser devices;

each reflector component corresponds to two of the N convex lenses and is disposed in emergent light directions of the two corresponding convex lenses, and the concave lens is disposed in an emergent light direction of the at least one reflector component;

an emergent light beam of the two convex lenses corresponding to each reflector component arrives at the reflector component and then arrives at the concave lens; and each reflector component is configured to reflect an emergent light beam of one of the two corresponding convex lenses and transmit an emergent light beam of the other of the two corresponding convex lenses.

8. The projection display device according to claim 7, wherein:

the at least one reflector component comprises at least one group of reflectors; and when an emergent light beam of one of the N convex lenses corresponding to the at least one group of reflectors is incident light of a group of reflectors in the reflector component, all the reflectors in the group of reflectors are positioned on a same plane and disposed at intervals, wherein a width of the intervals ensures transmission of the emergent light beam of another convex lens corresponding to the reflector component.

9. The projection display device according to claim 8, wherein a size of each reflector in the group of reflectors, of which the incident light is the emergent light beam of at least one of the two convex lenses corresponding to the reflector component, is determined according to a size of a light beam required to be reflected by the reflector; and a width of the interval of each reflector in the group of reflectors, of which the incident light is the emergent light beam of at least one of the two convex lenses corresponding to the reflector component, is determined according to a size of a light beam to pass through the interval.

10. The projection display device according to claim 7, wherein the at least one reflector component is a reflector with a wavelength selecting function.

11. The projection display device according to claim 7, wherein the at least one reflector component is a polarizer, and polarities of the emergent light beams of the two convex lenses corresponding to the polarizer are orthogonal.

* * * * *